United States Patent
Saito (10) Patent No.: US 6,908,801 B2
(45) Date of Patent: Jun. 21, 2005

(54) METHOD OF MANUFACTURING SEMICONDUCTOR DEVICE

(75) Inventor: Tomohiro Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/737,964

(22) Filed: Dec. 18, 2003

(65) Prior Publication Data

US 2005/0064663 A1 Mar. 24, 2005

(30) Foreign Application Priority Data

Sep. 19, 2003  (JP) ....................... 2003-327517

(51) Int. Cl.$^7$ .......................... H01L 21/8238
(52) U.S. Cl. ................ 438/199; 438/275; 438/592; 438/653; 438/656; 438/666
(58) Field of Search ................. 438/199, 275, 438/592, 653, 656, 666

(56) References Cited

U.S. PATENT DOCUMENTS

| | | | | |
|---|---|---|---|---|
| 6,303,418 B1 | * | 10/2001 | Cha et al. | 438/199 |
| 6,410,376 B1 | * | 6/2002 | Ng et al. | 438/199 |
| 6,444,512 B1 | * | 9/2002 | Madhukar et al. | 438/203 |
| 6,563,178 B2 | * | 5/2003 | Moriwaki et al. | 257/369 |
| 6,586,288 B2 | * | 7/2003 | Kim et al. | 438/183 |
| 6,737,309 B2 | * | 5/2004 | Matsuo | 438/199 |

FOREIGN PATENT DOCUMENTS

| | | |
|---|---|---|
| JP | 2001-284466 | 10/2001 |
| JP | 2002-198441 | 7/2002 |

* cited by examiner

*Primary Examiner*—Trung Dang
(74) *Attorney, Agent, or Firm*—Finnegan, Henderson, Farabow, Garrett & Dunner, L.L.P.

(57) ABSTRACT

A method of manufacturing a semiconductor device comprises forming a gate insulating film on a semiconductor substrate having first and second element regions, forming a mask on the entire surface of the gate insulating film, selectively etching the mask to form an opening for exposing a portion of the gate insulating film, forming a first conductive material film on the entire surface of the mask, patterning the first conductive material film to form a patterned first conductive material film, which is positioned in the first element region, etching away the exposed mask, forming a second conductive material having a work function different from that of the first conductive material film on the gate insulating film, and forming a first gate electrode having the first conductive material film and a second gate electrode made of the second conductive material film.

18 Claims, 8 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2003-327517, filed Sep. 19, 2003, the entire contents of which are incorporated herein by reference.

BACKGROUND OF THE INVENTION

1. Field of the Invention

The present invention relates to a method of manufacturing a semiconductor device, particularly, to a method of manufacturing a semiconductor device comprising gate electrodes of differing work functions.

2. Description of the Related Art

In recent years, it is has become of highest importance to lower the resistance of the gate electrode in accordance with the development of a MOSFET device of the sub-micron order. It was customary in the past to use a polycrystalline silicon (polysilicon) doped with an impurity for forming the gate electrode. However, a depletion layer is generated at the interface between the gate electrode formed of a polycrystalline silicon doped with an impurity and the gate insulating film. The generation of the depletion layer is substantially equal to an increase in the thickness of the gate insulating film so as to decrease the drive current of transistor. With progress in the miniaturization of the gate insulating film, the decrease of the drive current brings about a problem that cannot be neglected.

For suppressing the generation of the depletion layer in the gate electrode, it is effective to use a gate electrode made of a metal in place of a polycrystalline silicon. Also, the metal gate electrode has a work function corresponding to the mid band gap of silicon. Therefore, it is possible to use the metal gate electrode as a single gate electrode that permits forming symmetrical threshold voltages in, for example, the NMOS region and the PMOS region.

However, in the CMOS device comprising a metal gate electrode as, for example, a single gate electrode, the flat band voltage is decreased in each of the NMOS device region and the PMOS device region, which gives rise to the phenomenon that the threshold voltage is increased. For lowering the threshold voltage, it is possible to form a buried channel by means of a counter doping. In this case, however, the short channel effect of the MOSFET device is increased, which makes it impossible to achieve a fine device.

Such being the situation, it is proposed to form metal gates differing from each other in the work function in, for example, the NMOS region and the PMOS region of the CMOS structure. To be more specific, a method of forming a dual metal gate for a semiconductor device is disclosed in, for example, Japanese Patent Disclosure (Kokai) No. 2002-198441. The method for forming the dual metal gate disclosed in this prior art comprises preparing a semiconductor substrate including a PMOS region and an NMOS region and having a dummy gate formed in each of the PMOS region and the NMOS region, forming an interlayer insulating film on the semiconductor substrate in a manner to cover the dummy gates, polishing the interlayer insulating film until the dummy gates are exposed to the outside, forming a first trench defining a first metal gate by selectively removing any one of the dummy gates formed in the PMOS region and the NMOS region, successively forming a first gate insulating film and a first metal film on the entire region of the semiconductor substrate having the first trench formed therein, forming a first metal gate within the first trench by etching the first metal film and the first gate insulating film until the interlayer insulating film is exposed to the outside, forming a second trench defining a second metal gate region by removing the residual dummy gate, successively forming a second gate insulating film and a second metal film on the entire region of the semiconductor substrate having the second trench formed therein, and forming a second metal gate within the second trench by etching the second metal film and the second gate insulating film until the interlayer insulating film is exposed to the outside.

However, in the method disclosed in Japanese Patent Disclosure No. 2002-198441 quoted above, the first trench is formed by removing one dummy gate, followed by burying the first gate insulating film and the first metal gate in the first trench. Then, the second trench is formed by removing the residual dummy gate, followed by burying the second gate insulating film and the second metal gate in the second trench so as to form a dual metal gate. What should be noted is that, in this prior art, it is necessary to carry out twice the step of forming a gate insulating film so as to make the manufacturing process complex. What should also be noted is that, since the first metal gate is exposed to the outside in the step of forming the second gate insulating film, the reliability of the second gate insulating film is lowered. Further, if the second gate insulating film is formed under high temperatures not lower than 600° C., the exposed second metal gate tends to be deteriorated.

BRIEF SUMMARY OF THE INVENTION

According to a first aspect of the present invention, there is provided a method of manufacturing a semiconductor device, comprising:

forming a gate insulating film on a semiconductor substrate having first and second element regions;

forming a mask having an etching selectivity to the gate insulating film on an entire surface of the gate insulating film;

selectively etching the mask to form an opening for exposing a portion of the gate insulating film, which is positioned in the first element region;

forming a first conductive material film on an entire surface of the mask including the hole;

patterning the first conductive material film to form a patterned first conductive material film on the portion of the gate insulating film, which is positioned in the first element region, and to expose the mask;

etching away the exposed mask;

forming a second conductive material having a work function different from that of the first conductive material film on the gate insulating film including the patterned first conductive material film to cover a portion of the gate insulating film, which is positioned in the second element region, with the second conductive material film; and forming a first gate electrode having the first conductive material film on the gate insulating film in the first element region, and a second gate electrode made of the second conductive material film on the gate insulating film in the second element region.

According to a second aspect of the present invention, there is provided a method of manufacturing a semiconductor device, comprising:

forming a plurality of gate trenches in an interlayer insulating film on a semiconductor substrate having first and second element regions such that portions of a surface of the semiconductor substrate in which the element regions are positioned are exposed in bottoms of the gate trenches;.

forming a gate insulating film on an entire surface including the gate trenches;

forming a mask having an etching selectivity to the gate insulating film on an entire surface of the gate insulating film;

selectively etching the mask to form an opening for exposing the gate insulating film in the gate trench positioned in the first element region;

forming a first conductive material film on an entire surface of the mask including the hole;

patterning the first conductive material film to form a patterned first conductive material film in the hole including the gate trench positioned in the first element region, and to expose the mask;

etching away the exposed mask to expose the gate trench positioned in the second element region;

forming a second conductive material having a work function different from that of the first conductive material film on the gate insulating film including the patterned first conductive material film and the gate trench positioned in the second element region; and forming a first gate electrode having the first conductive material film on the gate insulating film in the gate trench in the first element region, and a second gate electrode made of the second conductive material film on the gate insulating film in the gate trench in the second element region.

According to a third aspect of the present invention, there is provided a method of manufacturing a semiconductor device, comprising:

forming a plurality of gate trenches in an interlayer insulating film on a semiconductor substrate having first and second element regions such that portions of a surface of the semiconductor substrate in which the element regions are positioned are exposed in bottoms of the gate trenches;

forming a gate insulating film on an entire surface including the gate trenches;

selectively forming a mask having an etching. selectivity to the gate insulating film on the gate insulating film in each gate trench;

selectively etching away the mask in the gate trench positioned in the first element region to expose the gate insulating film in the gate trench;

forming a first conductive material film on the gate insulating film in the exposed gate trench, on the interlayer insulating film, and on the residual mask;

patterning the first conductive material film to form a patterned first conductive material film on the interlayer insulating film including the gate insluting film in the gate trench positioned in the first element region, and to expose the residual mask;

etching away the exposed residual mask to expose the gate trench positioned in the second element region;

forming a second conductive material having a work function different from that of the first conductive material film on the gate insulating film including the patterned first conductive material film and the gate trench positioned in the second element region; and forming a first gate electrode having the first conductive material film on the gate insulating film in the gate trench in the first element region, and. a second gate electrode made of the second conductive material film on the gate insulating film in the gate trench in the second element region.

DETAILED DESCRIPTION OF THE INVENTION

Embodiments of the present invention will be described in detail below.

(First Embodiment)

(First Step)

A gate insulating film is formed on a semiconductor substrate having first and second element regions. On the entire surface of this gate insulating film, a mask having an etching selective ratio to the gate insulating film is formed. After that, this mask is selectively etched to form an opening for exposing that portion of the gate insulating film, which is positioned in the first element region.

The first and second element regions are isolated by, e.g., a shallow trench type element isolation region formed in the semiconductor substrate.

The gate insulating film is made of, e.g., a silicate or high-dielectric-constant insulating material. Especially when the gate insulating film is formed by a high-dielectric-constant insulating material, the film thickness can be increased, so a highly reliable semiconductor device can be manufactured by suppressing or preventing a gate leakage current. Examples of this high-dielectric-constant insulating material are $Ta_2O_5$, an oxide and oxynitride containing at least one metal selected from Hf, Al, Zr, and Pd, and a silicate.

The mask is made of any material as long as the material has an etching selectivity to the gate insulating film. The mask is particularly preferably made of a material which does not react with a first conductive material film. Examples are insulative materials such as TEOS, silazane, boron-phosphorus silicate glass (BPSG), and polyallylene.

(Second Step)

A first conductive material film is formed on the entire surface of the mask including the hole. This first conductive material film is then patterned to form a patterned first conductive material film in that portion of the gate insulating film, which is positioned in the first element region. In this state, the mask is exposed. This exposed mask is etched away to expose that portion of the gate insulating film, which is positioned in the second element region covered with the mask.

The etching of the mask in the first and second steps is preferably wet etching or chemical dry etching. By the use of this wet etching or chemical dry etching, etching damage to the underlying gate insulating film can be reduced compared to plasma etching.

(Third Step)

On the gate insulating film including the patterned first conductive material film, a second conductive material film having a work function different from that of the first conductive material film is formed. In this state, a portion of this second conductive material film is in direct contact with that portion of the gate insulating film, which is positioned in the second element region. Subsequently, the patterned first conductive material film and the second conductive material film are patterned by reactive ion etching (RIE) using, e.g., a resist pattern as a mask, thereby forming a first gate electrode which is a stacked film of the first and second conductive material films on the gate insulating film in the first element region. Simultaneously, a second gate electrode made of the second conductive material film is formed on the gate insulating film in the second element region. Although the first gate electrode thus formed has a stacked structure, the work function of this gate electrode is determined by the first conductive material film in contact with the gate insulating film.

Of the first and second conductive material films, a conductive material on the NMOS side is suitably a metal, metal nitride, silicide, or alloy having a work function of less than 4.6 eV. Examples are TiN, WN, TaN, MoSi, and WSi. A conductive material on the PMOS side is suitably a metal, silicide, or alloy having a work function of 4.6 eV or more. Examples are W, Ta, Pt, PtSix, and Mo. However, the present invention is not limited to the materials and work functions described above. Also, the work function of a conductive material sometimes changes in accordance with the film formation conditions, so the above-mentioned conductive materials are merely examples. For example, the work function of W changes between 4.3 to 5.2, so W can be used in both the NMOS and PMOS in some cases.

In the first embodiment as described above, a semiconductor device including the first and second gate electrodes made of the conductive materials having different work functions can be manufactured.

Also, the gate insulating film below the first and second gate electrodes having different work functions can be formed by only one film formation step. This simplifies the semiconductor device manufacturing process and makes mass production possible, compared to the conventional manufacturing process in which a gate insulating film must be formed whenever one of first and second metal gates having different work functions is formed, i.e., in which the gate insulating film formation step must be performed twice.

Furthermore, even if the gate insulating film is formed at a high temperature of, e.g., 600° C. or more, the first and second gate electrodes having different work functions are formed after the formation of this gate insulating film. Therefore, thermal influence on the gate electrodes in their formation step can be avoided, so a highly reliable semiconductor device can be manufactured.

(Second Embodiment)

(First Step)

A plurality of gate trenches are formed in an interlayer insulating film on a semiconductor substrate having first and second element regions such that those portions of the surface of the semiconductor substrate in which the element regions are positioned are exposed in the bottoms of these trenches. Subsequently, a gate insulting film is formed on the entire surface including the gate trenches. On the entire surface of this gate insulating film, a mask having an etching selectivity to the gate insulating film is formed. After that, this mask is selectively etched to form an opening for exposing the gate insulating film in the gate trench positioned in the first element region.

The first and second element regions are isolated by, e.g., a shallow trench type element isolation region formed in the semiconductor substrate.

A silicon oxide film, for example, can be used as the interlayer insulating film.

The same materials as explained in the first embodiment can be used as the gate insulating film and mask.

(Second Step)

A first conductive material film is formed on the entire surface of the mask including the hole. This first conductive material film is then patterned to form a patterned first conductive material film in the hole including the gate trench positioned in the first element region. At the same time, the mask is exposed. This exposed mask is etched away to expose the gate trench positioned in the second element region.

The patterned first conductive material film can be formed by, e.g., 1) patterning the first conductive material film by reactive ion etching (RIE) using a resist pattern as a mask, or 2) planarizing the first conductive material film by chemical mechanical polishing (CMP) until the mask surface except for the hole is exposed. In particular, the method 2) can simplify the process and planarize the surface compared to the method 1).

The etching of the mask in the first and second steps is preferably wet etching or chemical dry etching. By the use of this wet etching or chemical dry etching, etching damage to the underlying gate insulating film can be reduced compared to plasma etching.

(Third Step)

On the gate insulating film including the patterned first conductive material film and the gate trench positioned in the second element region, a second conductive material film having a work function different from that of the first conductive material film is formed. In this state, a portion of this second conductive material film is in direct contact with the gate insulating film in the gate trench positioned in the second element region. Subsequently, the patterned first conductive material film and the second conductive material film are patterned by reactive ion etching (RIE) using, e.g., a resist pattern as a mask, thereby forming a first gate electrode having a structure in which the first conductive material film is buried in the gate trench in the first element region via the gate insulating film. Simultaneously, a second gate electrode having a structure in which the second conductive material film is buried in the gate trench in the second element region via the gate insulating film is formed. Although the first gate electrode thus formed has a stacked structure, the work function of this gate electrode is determined by the first conductive material film in contact with the gate insulating film.

Of the first and second conductive material films, as described in the first embodiment, a conductive material on the NMOS side is suitably a metal, metal nitride, silicide, or alloy having a work function of less than 4.6 eV. Examples are TiN, WN, TaN, MoSi, and WSi. A conductive material on the PMOS side is suitably a metal, silicide, or alloy having a work function of 4.6 eV or more. Examples are W, Ta, Pt, PtSix, and Mo.

In the formation of the first and second gate electrodes, it is also possible to planarize the second conductive material film, patterned first conductive material film, and the gate insulating film by CMP until the surface of the interlayer insulating film except for the gate trenches is exposed, thereby burying the first gate electrode made of the first conductive material in the gate trench in the first element region via the gate insulating film, and burying the second gate electrode made of the second conductive material in the gate trench in the second element region via the gate insulting film. By this method, the surface can be planarized after the first and second gate electrodes are formed.

In the second embodiment as described above, a semiconductor device including the first and second gate electrodes formed by burying the conductive materials having different work functions in at least the gate trenches via the gate insulating film can be manufactured.

Also, the gate insulating film below the first and second gate electrodes having different work functions can be formed by only one film formation step. This simplifies the semiconductor device manufacturing process and makes mass production possible, compared to the conventional manufacturing process in which a gate insulating film must be formed whenever one of first and second metal gates having different work functions is formed, i.e., in which the gate insulating film formation step must be performed twice.

Furthermore, even if the gate insulating film is formed at a high temperature of, e.g., 600° C. or more, the first and second gate electrodes having different work functions are formed after the formation of this gate insulating film. Therefore, thermal influence on the gate electrodes in their formation step can be avoided, so a highly reliable semiconductor device can be manufactured.

(Third Embodiment)
(First Step)

A plurality of gate trenches are formed in an interlayer insulating film on a semiconductor substrate having first and second element regions such that those portions of the surface of the semiconductor substrate in which the element regions are positioned are exposed in the bottoms of these trenches. Subsequently, a gate insulting film is formed on the entire surface including the gate trenches. On the gate insulating film in each gate trench, a mask having an etching selective ratio to the gate insulating film is selectively formed. That is, the mask is buried in each gate trench.

The first and second element regions are isolated by, e.g., a thin trench type element isolation region formed in the semiconductor substrate.

A silicon oxide film, for example, can be used as the interlayer insulating film.

The same materials as explained in the first embodiment can be used as the gate insulating film and mask.

The selective formation of the mask in each gate trench can be performed by, e.g., forming the mask on the entire surface, and planarizing this mask by CMP until the gate insulating film on the interlayer insulating film except for the gate trenches is exposed.

(Second Step)

The mask in the gate trench positioned in the first element region is selectively etched away to expose the gate insulating film in this gate trench. Subsequently, a thin first conductive material film is formed on the exposed gate insulating film in the gate trench, the interlayer insulating film, and the residual mask. This first conductive material film is then patterned to form a patterned first conductive material film on the interlayer insulating film including the gate insulating film in the gate trench positioned in the first element region. At the same time, the residual mask is exposed.

The patterned first conductive material film can be formed by, e.g., patterning the first conductive material film by reactive ion etching (RIE) using a resist pattern as a mask.

(Third Step)

The exposed residual mask is etched away to expose the gate trench positioned in the second element region. On the gate insulating film including the patterned first conductive material film and the gate trench positioned in the second element region, a second conductive material film having a work function different from that of the first conductive material film is formed. In this state, a portion of this second conductive material film is in direct contact with the gate insulating film in the gate trench positioned in the second element region. Subsequently, the patterned first conductive material film and the second conductive material film are patterned by RIE using, e.g., a resist pattern as a mask, thereby forming a first gate electrode having a structure in which the first conductive material film is buried in the gate trench in the first element region via the gate insulating film. Simultaneously, a second gate electrode having a structure in which the second conductive material film is buried in the gate trench in the second element region via the gate insulating film is formed. Although the first gate electrode thus formed has a stacked structure, the work function of this gate electrode is determined by the first conductive material film in contact with the gate insulating film.

The etching of the mask in the second and third steps is preferably wet etching or chemical dry etching. By the use of this wet etching or chemical dry etching, etching damage to the underlying gate insulating film can be reduced compared to plasma etching.

Of the first and second conductive material films, as described in the first embodiment, a conductive material on the NMOS side is suitably a metal, metal nitride, silicide, or alloy having a work function of less than 4.6 eV. Examples are TiN, WN, TaN, MoSi, and WSi. A conductive material on the PMOS side is suitably a metal, silicide, or alloy having a work function of 4.6 eV or more. Examples are W, Ta, Pt, PtSix, and Mo.

In the formation of the first and second gate electrodes, it is also possible to planarize the second conductive material film, patterned first conductive material film, and the gate insulating film by CMP until the surface of the interlayer insulating film except for the gate trenches is exposed, thereby burying the first gate electrode made of the first conductive material in the gate trench in the first element region via the gate insulating film, and burying the second gate electrode made of the second conductive material in the gate trench in the second element region via the gate insulting film. By this method, the surface can be planarized after the first and second gate electrodes are formed.

In the third embodiment as described above, a semiconductor device including the first and second gate electrodes formed by burying the conductive materials having different work functions in at least the gate trenches via the gate insulating film can be manufactured.

Also, the gate insulating film below the first and second gate electrodes having different work functions can be formed by only one film formation step. This simplifies the semiconductor device manufacturing process and makes mass production possible, compared to the conventional manufacturing process in which a gate insulating film must be formed whenever one of first and second metal gates having different work functions is formed, i.e., in which the gate insulating film formation step must be performed twice.

Furthermore, even if the gate insulating film is formed at a high temperature of, e.g., 600° C. or more, the first and second gate electrodes having different work functions are formed after the formation of this gate insulating film. Therefore, thermal influence on the gate electrodes in their formation step can be avoided, so a highly reliable semiconductor device can be manufactured.

Examples of the present invention will be described below with reference to the accompanying drawing.

EXAMPLE 1

Figure 1A:
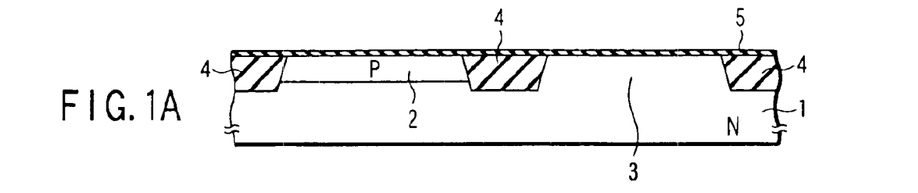
FIGS. 1A to 1F are sectional views showing the steps of manufacturing a complementary semiconductor device according to Example 1 of the present invention.

First, as shown in FIG. 1A, a buffer oxide film and silicon nitride film (neither is shown) were formed on an N-type semiconductor substrate (e.g., an N-type silicon wafer) 1, and a resist pattern (not shown) was formed on this silicon nitride film. This resist pattern was used as a mask to selectively etch the silicon nitride film, thereby forming a silicon nitride film pattern in an element region of the buffer oxide film. This silicon nitride film pattern was used as a mask to etch the buffer oxide film and the silicon wafer 1 by reactive ion etching, thereby forming trenches. Subsequently, a silicon oxide film was deposited on the entire surface and planarized to the upper surface of the silicon nitride film by CMP. After that, the silicon nitride film pattern and buffer oxide film were removed to form a shallow trench isolation (STI) region 4 for isolating a first element region 2 and second element region 3 in this order from the left side of FIG. 1A. After formation of the STI region 4, a P-type impurity, e.g., boron, was introduced by means of an ion implantation into the first element region 2, followed by activating the implanted boron atoms so as to form a P Well, i.e., NMOS region. Incidentally, the second element region 3 is formed into an N Well, i.e., PMOS region. Also, a P-type impurity, e.g., boron, or an N-type impurity, e.g., arsenic, for the channel control is introduced by means of an ion implantation into each of the element regions 2 and 3 of the silicon wafer 1, as required, followed by an annealing treatment for activating the implanted impurity ions, thereby controlling the impurity concentration in each of the element regions 2 and 3. Then, the buffer oxide film was then removed, and a 4 to 8 nm thick gate insulating film 5 made of $Ta_2O_5$ was formed on the element regions 2 and 3 of the silicon wafer 1 by CVD.

Figure 1B:
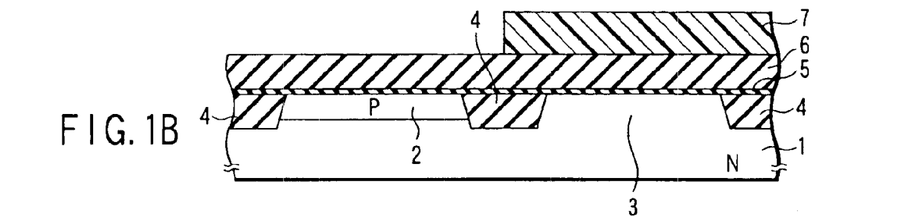
Figure 1C:
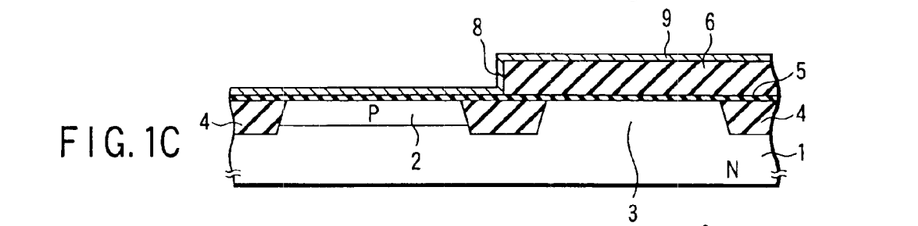

Subsequently, as shown in FIG. 1B, a 10 to 50 nm thick TEOS film 6 as a mask was formed on the entire surface, and a resist pattern 7 having an opening in a portion corresponding to the NMOS region 2 was formed. By decreasing the deposition (formation) temperature of the TEOS film 6 to 600° C. or less, deterioration of the $Ta_2O_5$ gate insulating film 5 can be reduced. As shown in FIG. 1C, the resist pattern 7 was used as a mask to selectively wet-etch the TEOS film 6 by using, e.g., an aqueous hydrofluoric acid solution, thereby forming an opening 8 for exposing that portion of the gate insulating film 5, which was positioned in the NMOS region 2. Since the TEOS film 6 was selectively etched by wet etching using an aqueous hydrofluoric acid solution, damage to the underlying gate insulating film could be suppressed. After the resist pattern 7 was removed, a 10 nm thick titanium nitride film (TiN film) 9 as a first conductive material film was deposited on the entire surface by CVD. In this state, a portion of the TiN film 9 was exposed in the opening 8 in the TEOS film 6, and formed on that portion of the gate insulating film 5, which was positioned in the NMOS region 2. Also, since the PMOS region 3 was covered with the TEOS film 6, it was possible to avoid direct contact of the TiN film 9 with the corresponding portion of the gate insulating film 5, and prevent influence on the gate insulating film 5 made of $Ta_2O_5$.

Figure 1D:
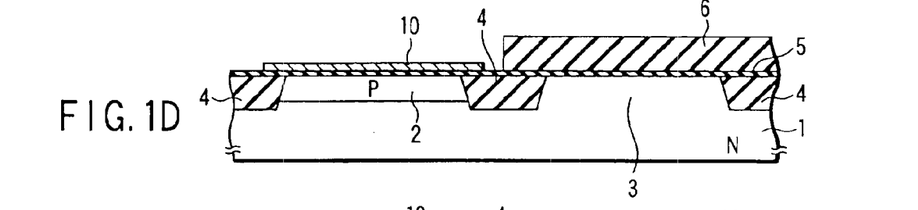
Figure 1E:
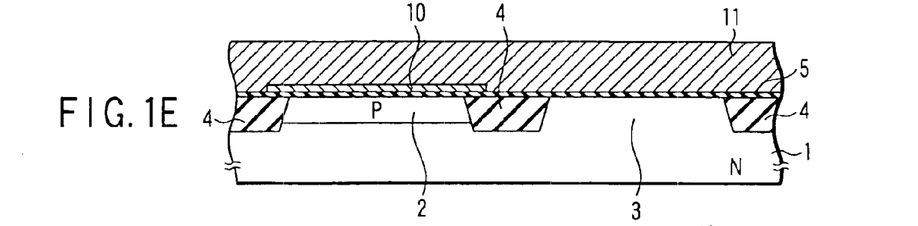

As shown in FIG. 1D, a resist pattern (not shown) was used as a mask to selectively wet-etch the TiN film 9 by, e.g., an aqueous peroxide solution, thereby forming a patterned TiN film 10 on that portion of the gate insulating film 5, which was positioned in the NMOS region 2. In this state, the gate insulating film 5 positioned in the PMOS region 3 was covered with the mask 6, and hence was not brought into contact with the aqueous peroxide solution as an etchant. As a consequence, high film quality when the film was formed could be maintained. Also, the TEOS film 6 as a mask was exposed. Subsequently, as shown in FIG. 1E, the exposed TEOS film 6 was removed by wet etching by using, e.g., an aqueous hydrofluoric acid solution, and a 250 nm thick tungsten (W) film 11 was deposited on the entire surface. Since the TEOS film 6 was removed by wet etching using an aqueous hydrofluoric acid solution, damage to the underlying gate insulating film 5 could be suppressed. Also, a portion of the W film 11 thus deposited was formed on that portion of the gate insulating film 5, which was positioned in the PMOS region 3.

Figure 1F:
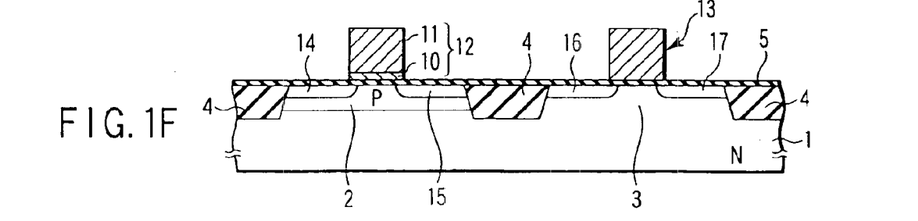

Subsequently, a resist pattern (not shown) was used as a mask to selectively remove, i.e., pattern both the W film 11 and patterned TiN film 10 and the W film 11 alone by anisotropic etching such as RIE, thereby forming a first gate electrode 12 made up of the TiN film 10 and W film 11 on the gate insulating film 5 in the NMOS region 2. Simultaneously, a second gate electrode 13 made of W and having one end connected to the first gate electrode 12 was formed in the PMOS region 3. After that, the resist pattern was removed, and another resist pattern was formed in the PMOS region 3. Then, an N-type impurity, e.g., arsenic, was introduced into the NMOS region 2 with the resist pattern and the first gate electrode 12 collectively used as a mask, followed by an activating heat treatment so as to form N-type source and drain diffusion layers 14 and 15. Subsequently, the resist pattern was removed, and another resist pattern was formed in the NMOS region 2. Then, a P-type impurity, e.g., boron, was introduced into the PMOS region 3 with the resist pattern and the second gate electrode 13 collectively used as a mask, followed by an activating heat treatment so as to form P-type source and drain diffusion layers 16 and 17 (FIG. 1F).

After that, although not shown, an interlayer insulating film such as a silicon oxide film was deposited, and contact holes are formed in those portions of this interlayer insulating film, which corresponded to the N-type source and drain diffusion layers and P-type source and drain diffusion layers. Ti/TiN was deposited on the silicon wafer exposed in the contact holes, and annealed to react with the wafer to form a silicide, thereby reducing the contact resistance. An Al film was then deposited and patterned to form, on the interlayer insulating film, interconnections connected to the N-type source and drain diffusion layers and P-type source and drain diffusion layers through the contact holes. In this manner, a complementary MOS semiconductor device (CMOS) including an NMOS having the first gate electrode containing TiN as a main gate material and a PMOS having the second gate electrode containing W as a main gate material was manufactured.

In Example 1 as described above, an NMOS having the first gate electrode 12 containing titanium nitride (TiN) as a main gate material and a PMOS having the second gate electrode 13 containing tungsten (W) as a main gate material could be formed on one chip. Consequently, a high-performance CMOS having a low threshold value could be manufactured without sacrificing performance such as sub-threshold swing.

Also, the gate insulating film 5 below the first and second gate electrodes 12 and 13 having different work functions could be formed by only one film formation step. Therefore, CMOS devices could be mass-produced compared to the conventional manufacturing process in which a gate insulating film must be formed whenever one of first and second metal gates having different work functions is formed, i.e., in which the gate insulating film formation step must be performed twice.

In addition, after being formed, the gate insulating film 5 (a gate insulating film portion functioning as a MOSFET) was covered with the TEOS film 6 as a mask when the TiN film 9 was patterned. Since this prevented contact with an aqueous peroxide solution as an etchant of the patterning, a CMOS having the gate insulating film 5 with high film quality could be manufactured.

Furthermore, the gate insulating film 5 was made of $Ta_2O_5$ as a high-dielectric-constant material, so the film thickness could be increased to, e.g., 4 to 8 nm. This made it possible to fabricate a highly reliable CMOS by suppressing or preventing a gate leakage current.

EXAMPLE 2

Figure 2A:
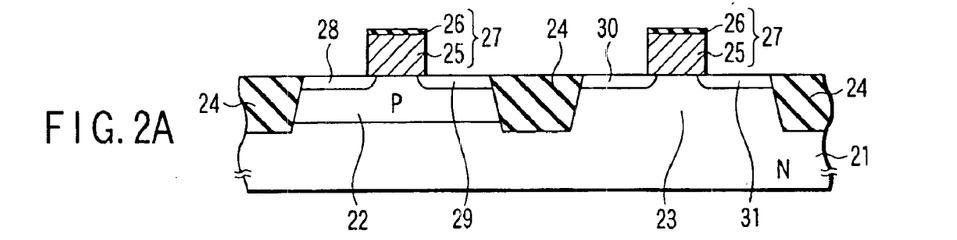
FIGS. 2A to 2I are sectional views showing the steps of manufacturing a complementary semiconductor device according to Example 2 of the present invention.

First, as shown in FIG. 2A, a shallow trench isolation (STI) region 24 for isolating first and second element regions 22 and 23 in this order from the left side of FIG. 2A was formed in an N-type semiconductor substrate (e.g., an N-type silicon wafer) 21 in the same manner as in Example 1 described above. Subsequently, a P-type impurity, e.g., boron, was introduced by means of an ion implantation into the first element region 22, followed by activating the implanted boron atoms so as to form a P Well, i.e., NMOS region. Incidentally, the second element region 23 is formed into an N Well, i.e., PMOS region. Also, a P-type. impurity, e.g., boron, or an N-type impurity, e.g., arsenic, for the channel control is introduced by means of an ion implantation into each of the element regions 22 and 23 of the silicon wafer 21, as required, followed by an annealing treatment for activating the implanted impurity ions, thereby controlling the impurity concentration in each of the element regions 22 and 23. Channel ion implantation is usually performed before gate electrodes are formed. In a damascene gate process, however, channel ion implantation need not be performed in this stage because it can be performed after gate trenches (to be described later) are formed. While a buffer oxide film remained, a 200 nm thick polysilicon film and 40 nm thick silicon nitride film were deposited in this order on the entire surface by CVD. A resist pattern (not shown) was then formed on the silicon nitride film, and the silicon nitride film and polysilicon film were etched by anisotropic etching such as RIE, thereby forming a dummy gate 27 as a stacked film of a polysilicon film 25 and silicon nitride film 26 in the element regions 22 and 23. The resist pattern was removed, and another resist pattern (not shown) was formed in the PMOS region 23. Then, an N-type impurity, e.g., arsenic, was introduced into the NMOS region 22 with the resist pattern and that portion of the dummy gate 27, which was positioned in the NMOS region 22, collectively used as a mask, followed by an activating heat treatment so as to form low-concentration N-type source and drain diffusion layers 28 and 29. Subsequently, the resist pattern was removed, and another resist pattern (not shown) was formed in the NMOS region 22. Then a P-type impurity, e.g., boron, was introduced into the PMOS region 23 with the resist pattern and that portion of the dummy gate 27, which was positioned in the PMOS region 23, collectively used as a mask, followed by an activating heat treatment so as to form low-concentration P-type source and drain diffusion layers 30 and 31.

Figure 2B:
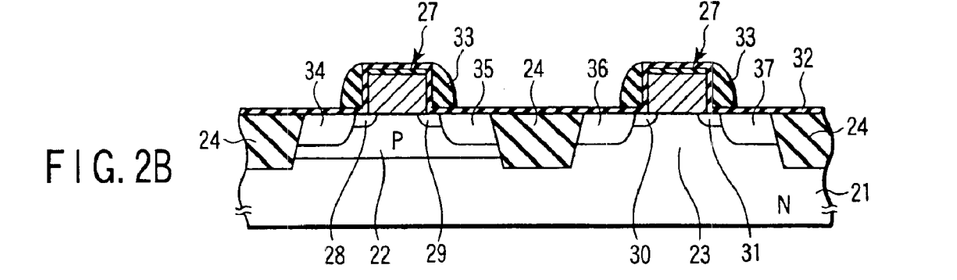

A 20 nm thick silicon nitride film 32 and 70 nm thick silicon oxide film were sequentially deposited on the silicon wafer 21 including the dummy gate 27, and the silicon oxide film was anisotropically etched by, e.g., RIE. In this state, as shown in FIG. 2B, side walls 33 made of silicon oxide were formed on the side surfaces of the dummy gate 27. A resist pattern (not shown) was then formed in the PMOS region 23. Then, an N-type impurity, e.g., arsenic, was introduced into the NMOS region 22 with the resist pattern and that portion and the side walls 33 of the dummy gate 27, which were positioned in the NMOS region 22, collectively used as a mask, followed by an activating heat treatment so as to form high-concentration N-type source and drain diffusion layers 34 and 35. Subsequently, the resist pattern was removed, and another resist pattern (not shown) was formed in the NMOS region 22. Then a P-type impurity, e.g., boron, was introduced into the PMOS region 23 with the resist pattern and that portion and the side walls 33 of the dummy gate 27, which were positioned in the PMOS region 23, collectively used as a mask, followed by an activating heat treatment so as to form high-concentration P-type source and drain diffusion layers 36 and 37. By these steps, the source and drain having an LDD structure were formed in each of the NMOS region 22 and PMOS region 23. Note that the resistance can be lowered by forming a silicide such as Ti or Co in these source and drain.

Figure 2C:
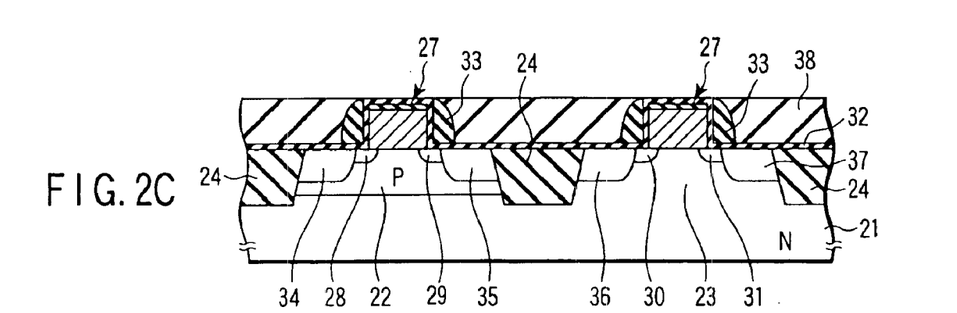
Figure 2D:
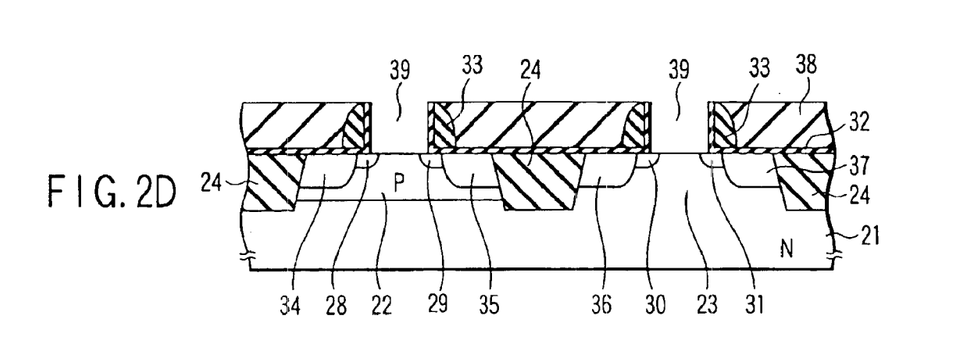

As shown in FIG. 2C, a silicon oxide film having a thickness of, e.g., 300 nm was deposited on the entire surface of the silicon wafer 21 including the dummy gate 27. After that, this silicon oxide film was planarized by CMP until the silicon nitride film 32 on the upper surface of the dummy gate 27 was exposed, thereby forming a first interlayer insulating film 38 having a flat surface. Subsequently, the silicon nitride film 32 exposed on the dummy gate 27 and the silicon nitride film 26 forming the dummy gate 27 were removed by thermal phosphoric acid processing, the polysilicon film 25 was removed by chemical dry etching (CDE), and the dummy gate 27 was removed by etching the buffer oxide film (not shown) by dilute hydrofluoric acid processing. By this step, as shown in FIG. 2D, a gate trench 39 was formed. Note that if ion implantation for adjusting the impurity concentration in the channel portion is not performed, an impurity can be doped into the channel region at this point.

Figure 2E:
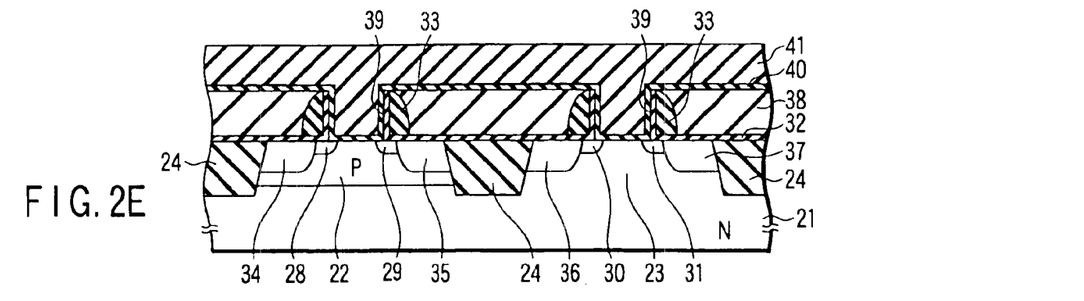

As shown in FIG. 2E, a $Ta_2O_5$ gate insulating film 40 was formed on the first interlayer insulating film 38 including the NMOS region 22 and PMOS region 23 exposed to the bottom surface of the gate trench 39. To prevent a reaction between Ta and the element regions 22 and 23, it is preferable to form an interface layer by nitriding the silicon surfaces of the element regions 22 and 23 before the formation of the gate insulating film 40. After the formation of the gate insulating film 40, post annealing can be performed to improve the film quality as needed. If a gate insulating film made of silicon nitride instead of $Ta_2O_5$ is to be formed, this gate insulating film may also be formed by oxidizing and nitrizing the silicon wafer 21 exposed to the bottom surface of the gate trench 39 after the buffer oxide film is removed. Subsequently, on the first interlayer insulating film 38 including the gate trench 39, a TEOS film 41 as a mask was deposited to have a thickness, e.g., 100 nm, larger than the depth of the gate trench 39. By decreasing the deposition (formation) temperature of the TEOS film 41 to 600° C. or less, deterioration of the $Ta_2O_5$ gate insulating film 40 can be reduced.

Figure 2F:
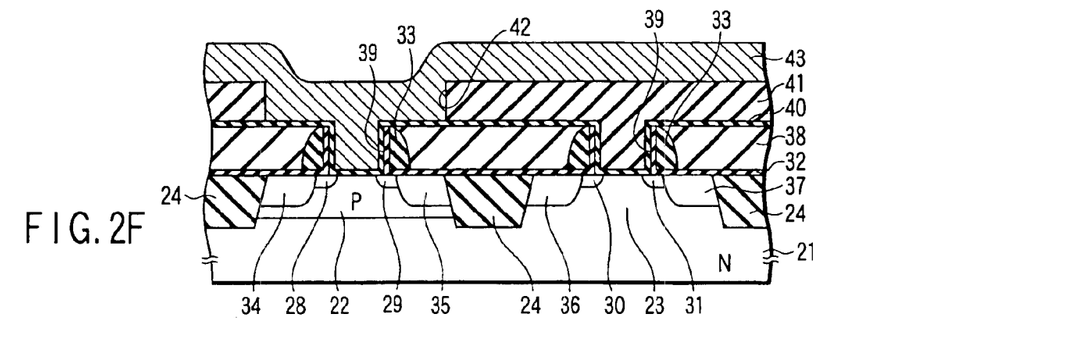

As shown in FIG. 2F, a resist pattern (not shown) was used as a mask to selectively wet-etch the TEOS film 41 by, e.g., an aqueous hydrofluoric acid solution, thereby forming an opening 42 for exposing that portion of the gate insulating film 40, which was positioned in the NMOS region 22. Since the TEOS film 41 was selectively etched by wet etching using an aqueous hydrofluoric acid solution, damage to the underlying gate insulating film 40 could be suppressed. After the resist pattern was removed, a titanium nitride film (TiN film) 43 as a first conductive material film was deposited on the entire surface by CVD so as to have a thickness of, e.g., 10 nm with which the gate trench 39 and the opening 42 in the TEOS film 41 were filled. In this state, a portion of the TiN film 43 was exposed in the opening 42 of the TEOS film 41 and in the gate trench 39, and formed on that portion of the gate insulating film 40, which was positioned in the NMOS region 22. Also, since the gate trench 39 in the PMOS region 23 was covered with the TEOS film 41, it was possible to avoid direct contact of the TiN film 43 with the gate insulating film 40 in the gate trench 39, and prevent influence on the gate insulating film 40 made of $Ta_2O_5$.

Figure 2G:
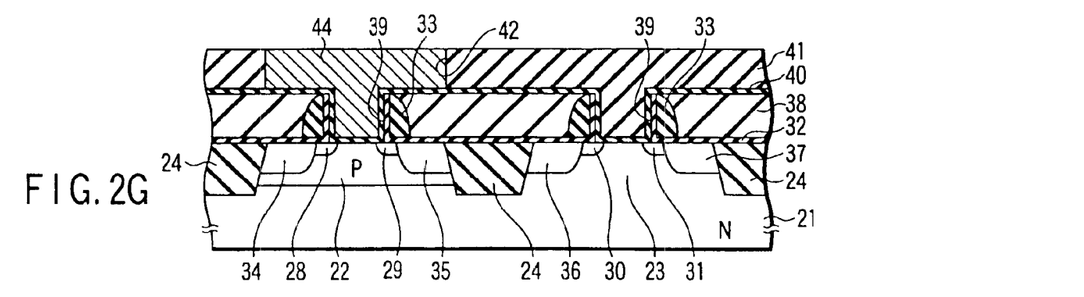
Figure 2H:
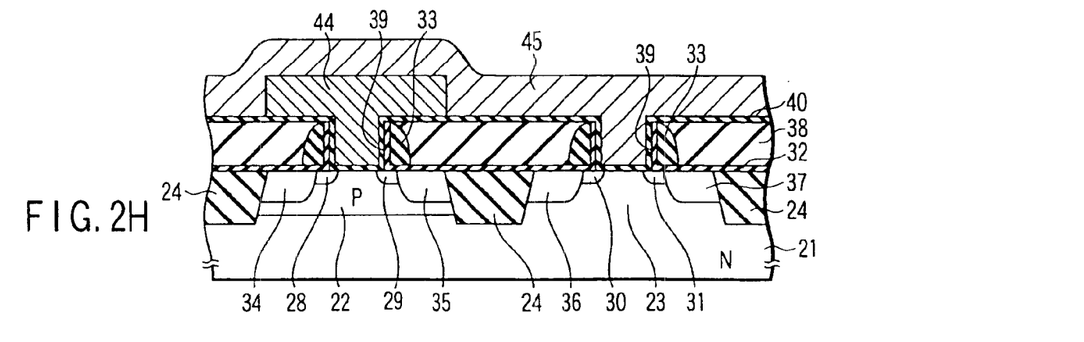

As shown in FIG. 2G, by planarizing the TiN film 43 by CMP, a buried TiN film 44 leveled with the TEOS film 41 was formed in the opening 42 of the TEOS film 41 and in the gate trench 39 in the NMOS region 22. Subsequently, as shown in FIG. 2H, the TEOS film 41 was removed by wet etching by using, e.g., an aqueous hydrofluoric acid solution, and a tungsten (W) film 45 was deposited on the entire surface so as to have a thickness of, e.g., 50 nm with which the exposed gate trench 39 was filled. Since the TEOS film 41 was removed by wet etching using an aqueous hydrofluoric acid solution, damage to the underlying gate insulating film 40 could be suppressed. Also, a portion of the W film 45 thus deposited was formed on that portion of the gate insulating film 40, which was positioned in the PMOS region 23.

Figure 2I:
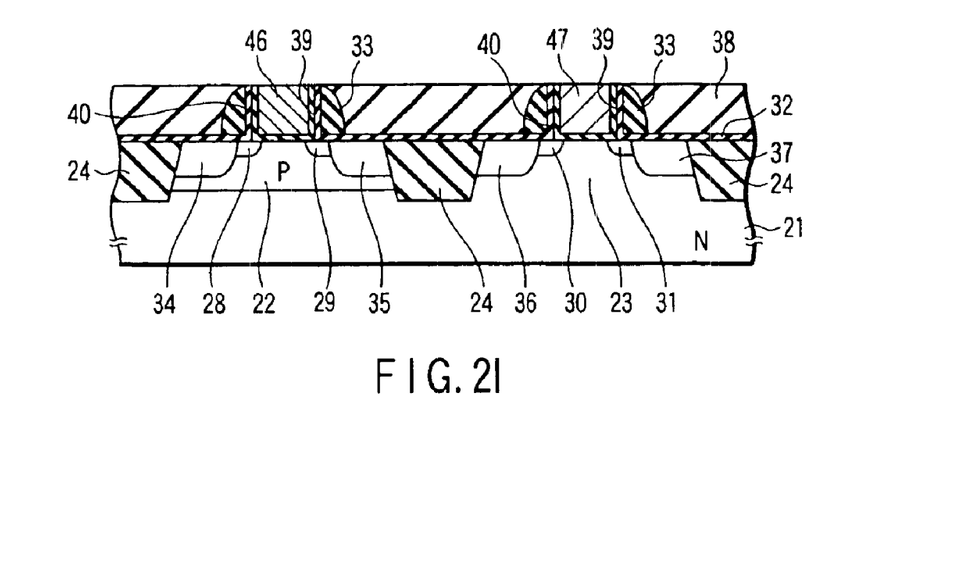
Figure 3:
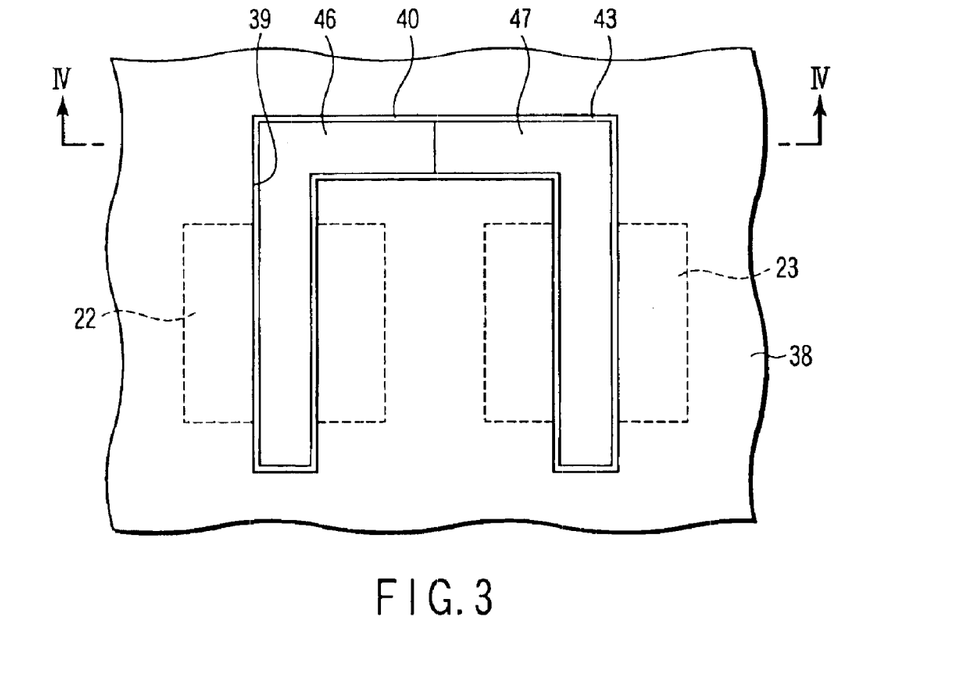
FIG. 3 is a plan view showing the complementary semiconductor device shown in FIG. 2I.
Figure 4:
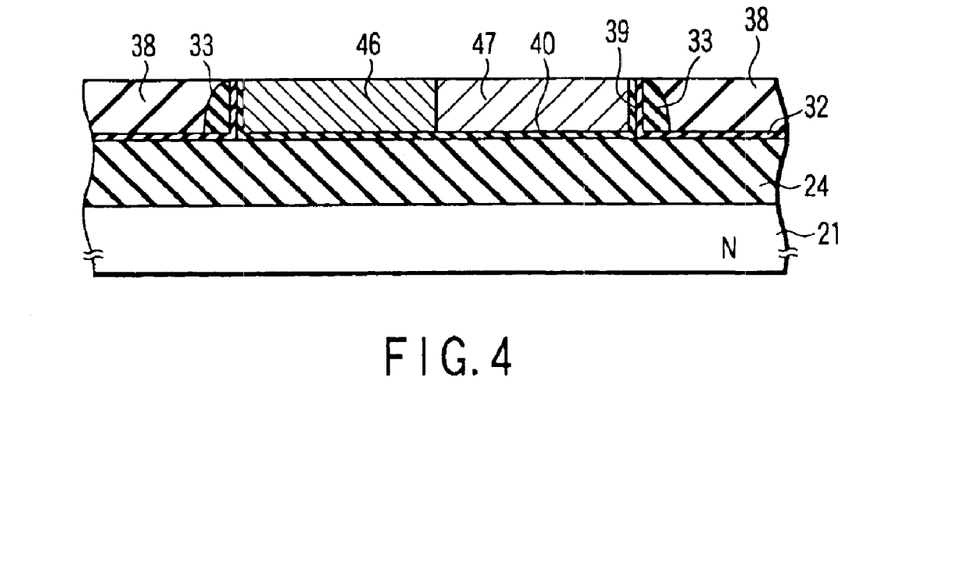
FIG. 4 is a sectional view taken along a line IV—IV of the complementary semiconductor device shown in FIG. 3.

The W film 45 and buried TiN film 44 were then planarized by CMP until a portion of the gate insulating film 40 on the first interlayer insulating film 38 was exposed, and the exposed portion of the gate insulating film 40 was also planarized by CMP. In this way, a first gate electrode 46 made of TiN was formed in that portion of the gate trench 39 in the first interlayer insulating film 38, which was positioned in the NMOS region 22, so as to be leveled with the interlayer insulating film 3B. Simultaneously, a second gate electrode 47 made of W was formed in that portion of the gate trench 39 in the first interlayer insulating film 38, which was positioned in the PMOS region 23, so as to be leveled with the interlayer insulating film 38 (FIGS. 2I, 3, and 4). FIG. 3 is an example of a plan view of FIG. 2I, and FIG. 4 is a sectional view taken along a line IV—IV of FIG. 3.

After that, although not shown, a second interlayer insulating film such as a silicon oxide film was deposited on the entire surface, and contact holes were formed in those portions of the first and second interlayer insulating films, which corresponded to the high-concentration, N-type source and drain diffusion layers and P-type source and drain diffusion layers. Ti/TiN was deposited on the silicon wafer exposed in the contact holes, and annealed to react with the wafer to form a silicide, thereby reducing the contact resistance. Subsequently, an Al film was deposited and patterned to form, on the second interlayer insulating film, interconnections connected to the N-type source and drain diffusion layers and P-type source and drain diffusion layers through the contact holes. In this manner, a complementary MOS semiconductor device (CMOS) including an NMOS having the first gate electrode 46 made of TiN, and a PMOS having the second gate electrode 47 made of W and having one end connected to the first gate electrode 46 was manufactured.

In Example 2 as described above, it was possible to form, on one chip, a PMOS and NMOS in which the first gate electrode 46 and second gate electrode 47 made of titanium nitride (TiN) and tungsten (W), respectively, and having different work functions were buried in the gate trench 39 of the first interlayer insulating film 38. Consequently, a high-performance CMOS having a low threshold value could be manufactured without sacrificing performance such as sub-threshold swing.

Also, the gate insulating film 40 below the first and second gate electrodes 46 and 47 having different work functions could be formed by only one film formation step. Accordingly, CMOS devices could be mass-produced compared to the conventional manufacturing process in which a gate insulating film must be formed whenever one of first and second metal gates having different work functions is formed, i.e., in which the gate insulating film formation step must be performed twice.

In addition, after the gate insulating film 40 was formed, that portion of the gate insulating film 40, which was positioned in the PMOS region 23 was covered with the TEOS film 41 as a mask when the TiN film 43 was deposited. Therefore, it was possible to prevent a direct contact of the TiN film 43, and manufacture a CMOS having the gate insulating film 40 with high film quality.

Furthermore, the gate insulating film 40 was made of $Ta_2O_5$ as a high-dielectric-constant material, so the film thickness could be increased to, e.g., 4 to 8 nm. This made it possible to fabricate a highly reliable CMOS by suppressing or preventing a gate leakage current.

Figure 5:
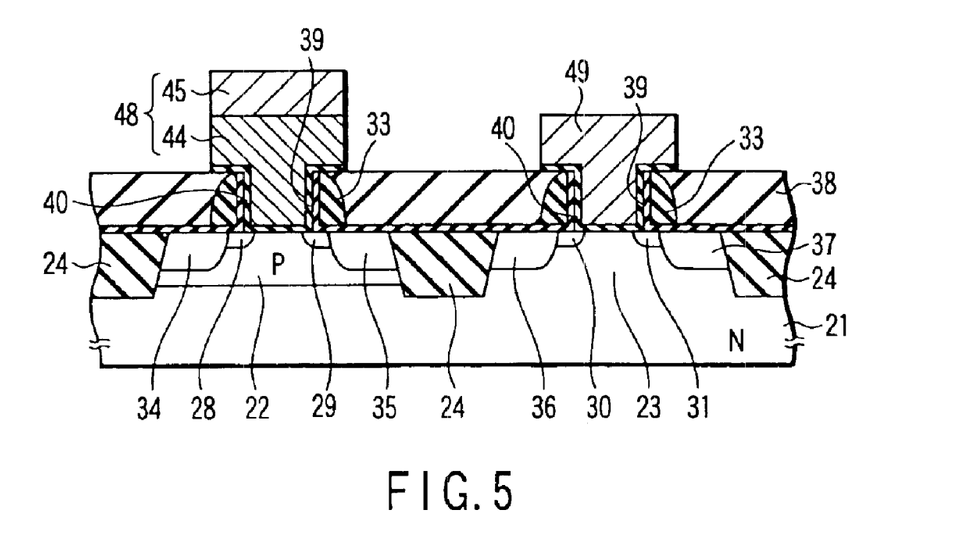
FIG. 5 is a sectional view showing a modification of the complementary semiconductor device according to Example 2 of the present invention.

In Example 2 described above, the first and second gate electrodes 46 and 47 were buried in the gate trench 39 of the first interlayer insulating film 38. However, the present invention is not limited to this structure. For example, after the W film 45 is deposited in the step shown in FIG. 2H described previously, the W film 45, TiN film 44, and gate insulating film 40 may also be subjected to RIE using a resist pattern as a mask, instead of CMP. As shown in FIG. 5, this step forms a first gate electrode 48 made of the TiN film 44 and W film 45, partially buried in the gate trench 39, and projecting from the surface of the interlayer insulating film 38, and a second gate electrode 49 made of W, partially buried in the gate trench 39, and projecting from the surface of the interlayer insulating film 38.

EXAMPLE 3

Figure 6A:
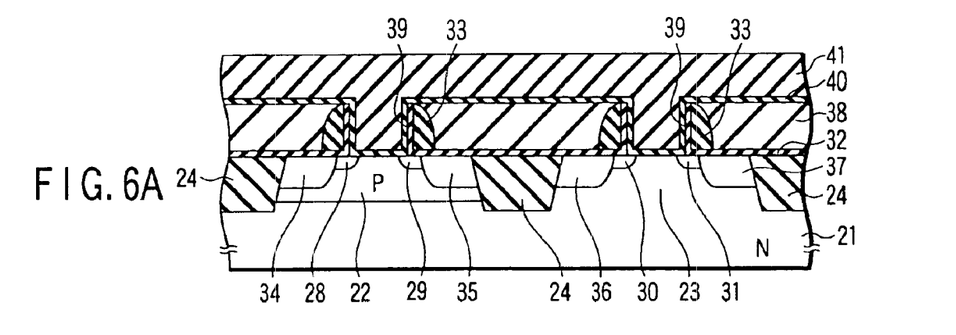
FIGS. 6A to 6G are sectional views showing the steps of manufacturing a complementary semiconductor device according to Example 3 of the present invention.

Following the same procedures as in Example 2 described above, a gate trench 39 was formed. Subsequently, a $Ta_2O_5$ gate insulating film 40 was formed on a first interlayer insulating film 38 including the NMOS region 22 and PMOS region 23 exposed to the bottom surface of the gate trench 39. On the first interlayer insulating film 38 including the gate trench 39, a TEOS film 41 as a mask was deposited to have a thickness, e.g., 100 nm, larger than the depth of the gate trench 39 (FIG. 6A).

Figure 6B:
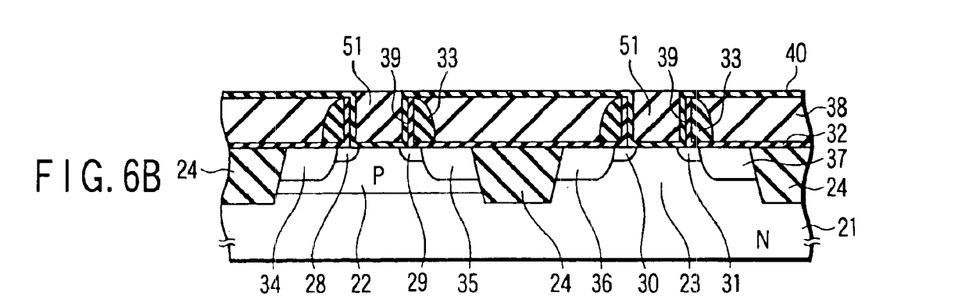
Figure 6C:
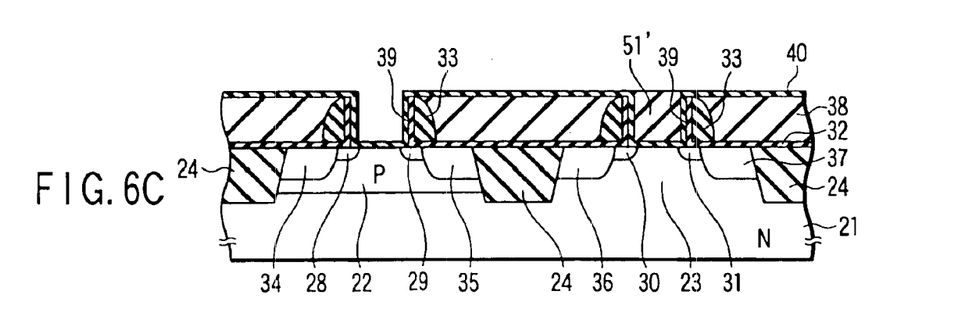

As shown in FIG. 6B, the TEOS film 41 was planarized by CMP until the gate insulating film 40 on the first interlayer insulating film 38 was exposed, thereby forming a TEOS buried material 51. As shown in FIG. 6C, the TEOS buried material 51 in that portion of the gate trench 39, which was positioned in the NMOS region 22 was selectively removed by wet etching using, e.g., an aqueous hydrofluoric acid solution, thereby exposing the gate insulating film 40 in that portion of the gate trench 39, which was positioned in the NMOS region 22. Since the TEOS buried material 51 was selectively etched by wet etching using an aqueous hydrofluoric acid solution, damage to the underlying gate insulating film 40 could be suppressed.

Figure 6D:
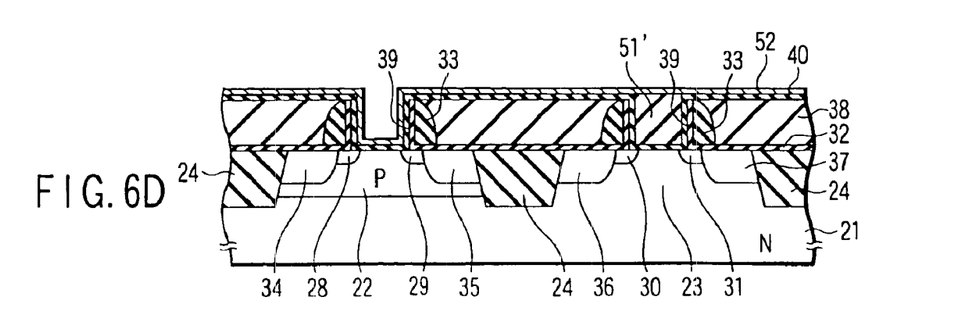

As shown in FIG. 6D, a titanium nitride film (TiN film) 52 having a thickness of, e.g., 10 nm as a first conductive material film was deposited on the entire surface including the exposed gate trench 39 by CVD. The TiN film 52 can be a thin film having a thickness of 10 nm because the TiN film 52 merely determines a work function. In this step, a portion of the TiN film 52 was formed on the gate insulating film 40 in the exposed gate trench 39 positioned in the NMOS region 22. Also, since the gate trench 39 in the PMOS region 23 was covered with a TEOS buried material 51', it was possible to avoid direct contact of the TiN film 52 with the gate insulating film 40 in the gate trench 39, and prevent influence on the gate insulating film 40 made of $Ta_2O_5$.

Figure 6E:
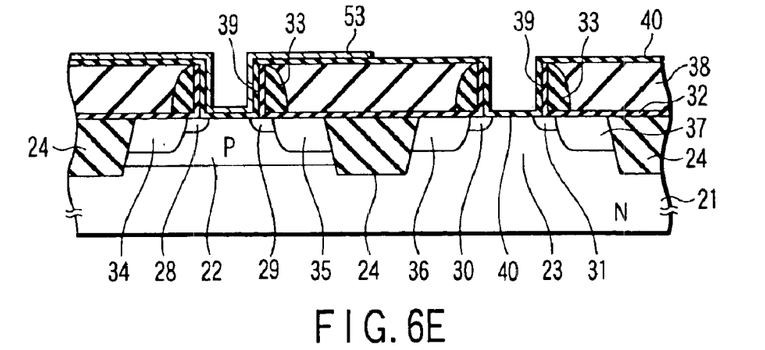

As shown in FIG. 6E, a resist pattern (not shown) was used as a mask to selectively wet-etch the TiN film 52 by using, e.g., an aqueous peroxide solution so as to expose the TEOS buried material 51' remaining in the gate trench 39 positioned in the PMOS region 23, thereby forming a patterned TiN film 53. The gate insulating film 40 in the gate trench 39 positioned in the PMOS region 23 was covered with the TEOS buried material 51', and hence did not come into contact the aqueous peroxide solution as an etchant. As a consequence, high film quality when the film was formed could be maintained. Subsequently, the exposed portion of the residual TEOS buried material 51' was selectively removed by wet etching using, e.g., an aqueous hydrofluoric acid solution, thereby exposing the gate insulating film 40 in the gate trench 39. Since the TEOS buried material 51' was selectively removed by wet etching using an aqueous hydrofluoric acid solution, damage to the underlying gate insulating film 40 could be suppressed.

Figure 6F:
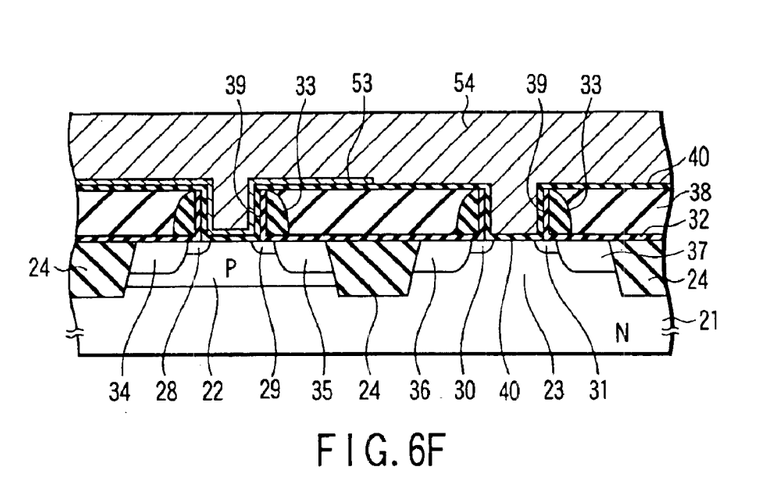

As shown in FIG. 6F, a tungsten (W) film 54 was deposited on the entire surface to have a thickness, e.g., 50 nm, larger than the depth of the exposed gate trench 39. A portion of the W film 54 thus deposited was formed on the gate insulating film 40 in the gate trench 39 positioned in the PMOS region 23.

Figure 6G:
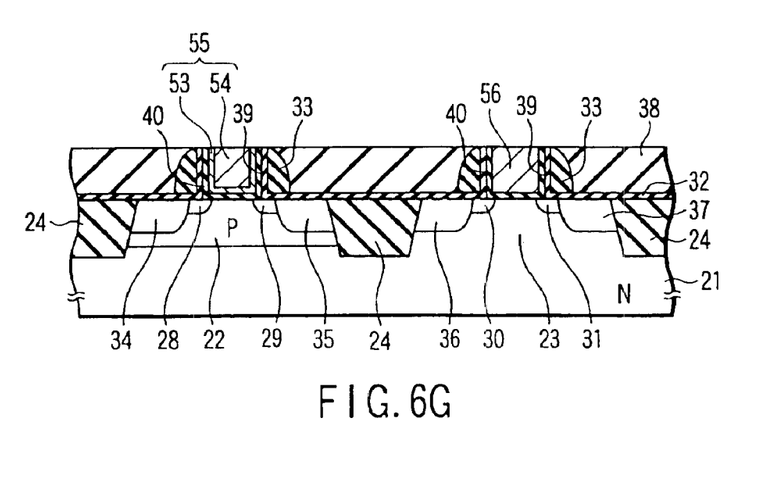
Figure 7:
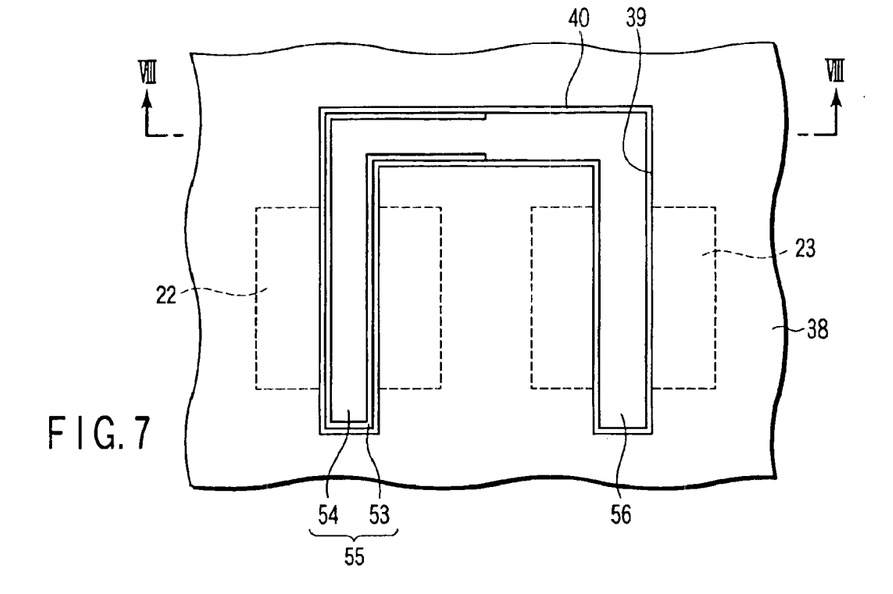
FIG. 7 is a plan view showing the complementary semiconductor device shown in FIG. 6G.
Figure 8:
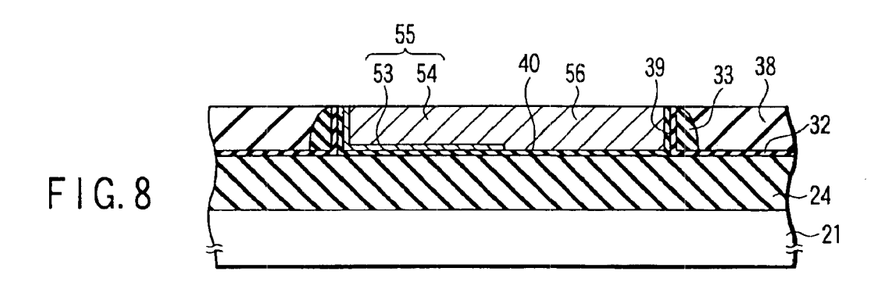
FIG. 8 is a sectional view taken along a line VIII—VIII of the complementary semiconductor device shown in FIG. 7.

The W film 54 and patterned TiN film 53 were then planarized by CMP until a portion of the gate insulating film 40 on the first interlayer insulating film 38 was exposed, and the exposed portion of the gate insulating film 40 was further planarized by CMP. In this way, a first gate electrode 55 made of the TiN film 53 and W film 54 was formed in that portion of the gate trench 39 in the first interlayer insulating film 38, which was positioned in the NMOS region 22, so as to be leveled with the interlayer insulating film 38. Simultaneously, a second gate electrode 56 made of W was formed in that portion of the gate trench 39 in the first interlayer insulating film 38, which was positioned in the PMOS region 23, so as to be leveled with the interlayer insulating film 38 (FIGS. 6G, 7, and 8). FIG. 7 is an example of a plan view of FIG. 6G, and FIG. 8 is a sectional view taken along a line VIII—VIII of FIG. 7.

After that, although not shown, a second interlayer insulating film such as a silicon oxide film was deposited on the entire surface, and contact holes were formed in those portions of the first and second interlayer insulating films, which corresponded to the high-concentration, N-type source and drain diffusion layers and P-type source and drain diffusion layers. Ti/TiN was deposited on the silicon wafer exposed in the contact holes, and annealed to react with the wafer to form a silicide, thereby reducing the contact resistance. Subsequently, an Al film was deposited and patterned to form, on the second interlayer insulating film, interconnections connected to the N-type source and drain diffusion layers and P-type source and drain diffusion layers through the contact holes. In this manner, a complementary MOS semiconductor device (CMOS) including an NMOS having the first gate electrode 55 made of the TiN film 53 and W film 54, and a PMOS having the second gate electrode 56 made of W and having one end connected to the first gate electrode 55 was manufactured.

In Example 3 as described above, it was possible to form, on one chip, a PMOS and NMOS in which the first gate electrode 55 and second gate electrode 56 made of titanium nitride (TiN) and tungsten (W), respectively, and having different work functions were buried in the gate trench 39 of the first interlayer insulating film 38. Consequently, a high-performance CMOS having a low threshold value could be manufactured without sacrificing performance such as sub-threshold swing.

Also, the gate insulating film 40 below the first and second gate electrodes 55 and 56 having different work functions could be formed by only one film formation step. Therefore, CMOS devices could be mass-produced compared to the conventional manufacturing process in which a gate insulating film must be formed whenever one of first and second metal gates having different work functions is formed, i.e., in which the gate insulating film formation step must be performed twice.

In addition, after the gate insulating film 40 was formed, that portion of the gate insulating film 40, which was positioned in the PMOS region 23 was covered with the residual TEOS buried material 51' as a mask when the TiN film 52 was deposited. Accordingly, it was possible to avoid direct contact of the TiN film 52. Also, the gate insulting film 40 in the gate trench 39 positioned in the PMOS region 23 was covered with the residual TEOS buried material 51' when the TiN film 52 was patterned, and hence did not come into contact with an aqueous peroxide solution as an etchant of the patterning. This made it possible to fabricate a CMOS having the gate insulating film 40 with high film quality.

Furthermore, the gate insulating film 40 was made of $Ta_2O_5$ as a high-dielectric-constant material, so the film thickness could be increased to, e.g., 4 to 8 nm. This made it possible to fabricate a highly reliable CMOS by suppressing or preventing a gate leakage current.

Figure 9:
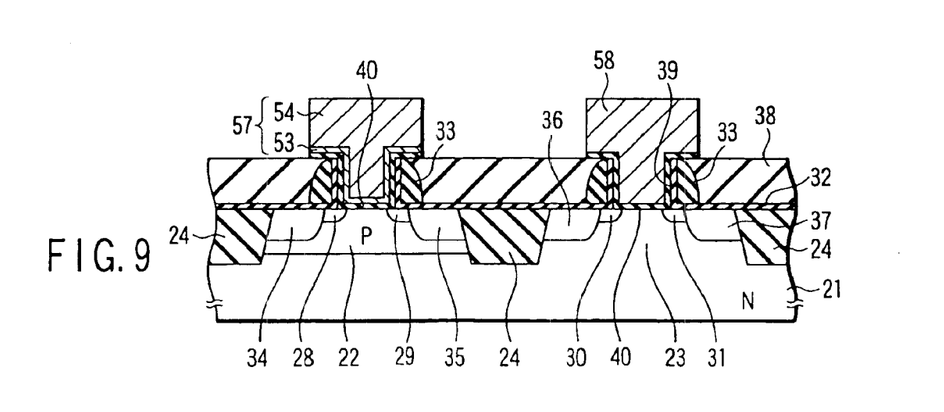
FIG. 9 is a sectional view showing a modification of the complementary semiconductor device according to Example 3 of the present invention.

In Example 3 described above, the first and second gate electrodes 55 and 56 were buried in the gate trench 39 of the first interlayer insulating film 38. However, the present invention is not limited to this structure. For example, after the W film 54 is deposited in the step shown in FIG. 6F described previously, the W film 54, patterned TiN film 53, and gate insulating film 40 may also be subjected to RIE using a resist pattern as a mask, instead of CMP. As shown in FIG. 9, this step forms a first gate electrode 57 made of the TiN film 53 and W film 54, partially buried in the gate trench 39, and projecting from the surface of the interlayer insulating film 38, and a second gate electrode 58 made of W, partially buried in the gate trench 39, and projecting from the surface of the interlayer insulating film 38.

The present invention is not limited to the above embodiments and can be practiced in the form of various modifications explained below without departing from the scope and spirit of the present invention.

(1) The gate electrode combination is not limited to W and TiN.

(2) The gate insulating film is also not limited to $Ta_2O_5$. Examples are a silicon oxide film, a silicon nitride film, and a silicate of a high-dielectric-constant material and silicon.

(3) The present invention is a method of manufacturing a semiconductor device having two or more different work functions, and is not necessarily limited to the electrodes of NMOS and PMOS transistors of a complementary MOS. For example, the present invention is also applicable to a device in which a transistor's electrode and a control gate in a memory region are to be formed by metals having different work functions. Another example is a transistor combination of a mid-gap electrode and N- or p-type gate.

(4) The gate shape is also not limited to a U shape. The electrodes of both an NMOS and PMOS need not be formed in one gate trench. That is, the electrode of only an NMOS or PMOS may also be formed in one gate trench.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A method of manufacturing a semiconductor device, comprising:

forming a gate insulating film on a semiconductor substrate having first and second element regions;

forming a mask having an etching selectivity to the gate insulating film on an entire surface of the gate insulating film;

selectively etching the mask to form an opening for exposing a portion of the gate insulating film, which is positioned in the first element region;

forming a first conductive material film on an entire surface of the mask including the hole;

patterning the first conductive material film to form a patterned first conductive material film on the portion of the gate insulating film, which is positioned in the first element region, and to expose the mask;

etching away the exposed mask;

forming a second conductive material having a work function different from that of the first conductive material film on the gate insulating film including the patterned first conductive material film to cover a portion of the gate insulating film, which is positioned in the second element region, with the second conductive material film; and forming a first gate electrode having the first conductive material film on the gate insulating film in the first element region, and a second gate electrode made of the second conductive material film on the gate insulating film in the second element region.

2. A method according to claim 1, wherein the gate insulating film is made of a high-dielectric-constant insulating material.

3. A method according to claim 1, wherein the mask is made of TEOS.

4. A method according to claim 1, wherein the etching process of the mask is wet etching or chemical dry etching.

5. A method according to claim 1, wherein the first conductive material film is a metal nitride film, and the second conductive material film is a metal film.

6. A method of manufacturing a semiconductor device, comprising:

forming a plurality of gate trenches in an interlayer insulating film on a semiconductor substrate having first and second element regions such that portions of a surface of the semiconductor substrate in which the element regions are positioned are exposed in bottoms of the gate trenches;

forming a gate insulating film on an entire surface including the gate trenches;

forming a mask having an etching selectivity to the gate insulating film on an entire surface of the gate insulating film;

selectively etching the mask to form an opening for exposing the gate insulating film in the gate trench positioned in the first element region;

forming a first conductive material film on an entire surface of the mask including the hole;

patterning the first conductive material film to form a patterned first conductive material film in the hole including the gate trench positioned in the first element region, and to expose the mask;

etching away the exposed mask to expose the gate trench positioned in the second element region;

forming a second conductive material having a work function different from that of the first conductive material film on the gate insulating film including the patterned first conductive material film and the gate trench positioned in the second element region; and forming a first gate electrode having the first conductive material film on the gate insulating film in the gate trench in the first element region, and a second gate electrode made of the second conductive material film on the gate insulating film in the gate trench in the second element region.

7. A method according to claim 6, wherein the gate insulating film is made of a high-dielectric-constant insulating material.

8. A method according to claim 6, wherein the mask is made of TEOS.

9. A method according to claim 6, wherein the etching process of the mask is wet etching or chemical dry etching.

10. A method according to claim 6, wherein the first conductive material film is a metal nitride film, and the second conductive material film is a metal film.

11. A method according to claim 6, wherein the first conductive material film is patterned by planarizing the first conductive material film by chemical mechanical polishing until the mask surface except for the hole is exposed.

12. A method according to claim 6, wherein the step of forming the gate electrodes is done by planarizing the second conductive material film, patterned first conductive material film, and gate insulating film by chemical mechanical polishing, until a surface of the interlayer insulating film except for the gate trenches is exposed.

13. A method of manufacturing a semiconductor device, comprising:

forming a plurality of gate trenches in an interlayer insulating film on a semiconductor substrate having first and second element regions such that portions of a surface of the semiconductor substrate in which the element regions are positioned are exposed in bottoms of the gate trenches;

forming a gate insulating film on an entire surface including the gate trenches;

selectively forming a mask having an etching selectivity to the gate insulating film on the gate insulating film in each gate trench;

selectively etching away the mask in the gate trench positioned in the first element region to expose the gate insulating film in the gate trench;

forming a first conductive material film on the gate insulating film in the exposed gate trench, on the interlayer insulating film, and on the residual mask;

patterning the first conductive material film to form a patterned first conductive material film on the interlayer insulating film including the gate insulting film in the gate trench positioned in the first element region, and to expose the residual mask;

etching away the exposed residual mask to expose the gate trench positioned in the second element region;

forming a second conductive material having a work function different from that of the first conductive material film on the gate insulating film including the patterned first conductive material film and the gate trench positioned in the second element region; and forming a first gate electrode having the first conductive material film on the gate insulating film in the gate trench in the first element region, and a second gate electrode made of the second conductive material film on the gate insulating film in the gate trench in the second element region.

14. A method according to claim 13, wherein the gate insulating film is made of a high-dielectric-constant insulating material.

15. A method according to claim 13, wherein the mask is made of TEOS.

16. A method according to claim 13, wherein the etching process of the mask is wet etching or chemical dry etching.

17. A method according to claim 13, wherein the first conductive material film is a metal nitride film, and the second conductive material film is a metal film.

18. A method according to claim 13, wherein the step of forming the gate electrodes is done by planarizing the second conductive material film, patterned first conductive material film, and gate insulating film by chemical mechanical polishing, until a surface of the interlayer insulating film except for the gate trenches is exposed.

* * * * *